Aug. 3, 1965 R. C. A. ELAND 3,199,032
FM TUNER WITH AUTOMATIC FREQUENCY CONTROL
Original Filed Aug. 26, 1958
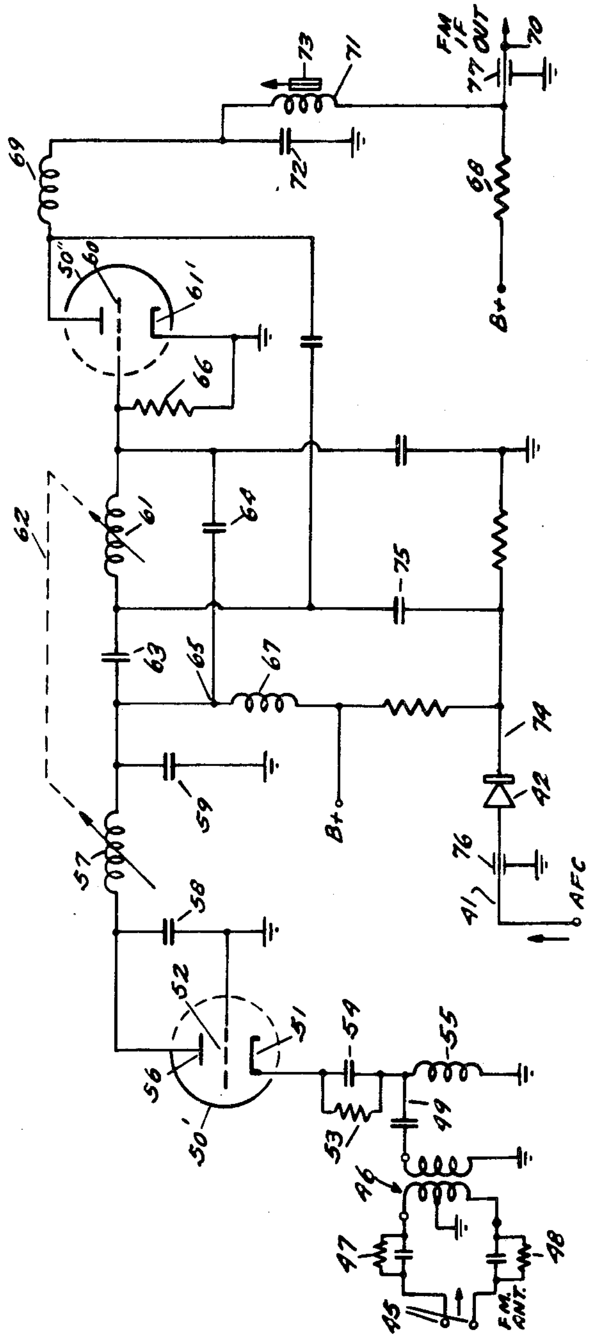
INVENTOR.
ROBERT C. A. ELAND
BY
OSTROLENK, FABER, GERB & SOFFEN
ATTORNEYS 3,199,032
Patented Aug. 3, 1965

3,199,032

FM TUNER WITH AUTOMATIC FREQUENCY CONTROL

Robert C. A. Eland, Pasadena, Calif., assignor to Standard Kollsman Industries, Inc., Melrose Park, Ill., a corporation of Illinois Original application Aug. 26, 1958, Ser. No. 757,248, now Patent No. 3,135,922, dated June 2, 1964. Divided and this application July 16, 1962, Ser. No. 209,928
3 Claims. (Cl. 325—453)

This invention relates generally to FM tuners, and more particularly to novel, effective, and economical automatic frequency control (AFC) circuitry therefor. This case is a division of my copending application Serial No. 757,248 filed August 26, 1958, for Television FM Tuner Converter, now U.S. Patent No. 3,135,922, and assigned to the same assignee.

As is well known in the art, a practical FM tuner circuit incorporates automatic frequency control (AFC) for stability of operation. Heretofore FM tuners have utilized at least one additional vacuum tube stage to provide such AFC. Such stage served as a variable reactance under the control of an AFC voltage or signal that usually was applied from the discriminator or ratio detector.

In accordance with the present invention the tuner AFC circuit is provided. The tuning of the FM tuner sections is with axially adjustable metallic slugs providing a logrithmic frequency change with linear displacements. The AFC circuit for the FM tuner is provided with a silicon junction diode in a novel manner to be described in more detail hereinafter, eliminating the complexity and power requirements of prior vacuum tube circuitry therefor.

The above features, objects and advantages of the present invention will become more apparent from the following description of an exemplary embodiment thereof, taken in connection with the drawing, in which:

The drawing is a schematic electrical diagram of the FM tuner of the present invention.

The drawing is the electrical diagram of the exemplary FM tuner. Such tuner is readily usable in a TV conversion circuit such as indicated in FIGURES 1 and 3 of the parent case. This FM tuner is usable also for the direct reception of broadcast FM radio signals in a broadcast receiver. An FM antenna is connected to input terminals 45, 45 of a conventional 300 to 150 ohm ferrite balun 46. Antenna isolation R-C units 47, 48 are inserted between the FM antenna and balun 46, when required.

Output lead 49 connects to the input cathode 51 of RF amplifier section 50′ of a dual-purpose single vacuum tube. The grid electrode 52 of triode 50′ is signal grounded. A self-biasing resistor 53 with a by-pass condenser 54 is connected between signal lead 49 and cathode 51. An RF choke 55 is provided to complete the D.C. circuit for tube 50′ without interfering with the FM signal input thereto. The triode section 50′ amplifies the FM-RF signals.

The anode 56 output of triode 50′ is connected to a pi-tuned network comprising tunable inductance 57 and shunt condensers 58 and 59. The output of the pi-tuned network 57, 58, 59 is coupled to the input grid 60 of the autodyne mixer-oscillator section 50″ of the composite duel triode tube. A suitable commercial tube for the 50′–50″ triodes is 6DT8. The mixer-oscillator section 50″ is an autodyne circuit incorporating tunable oscillator coil 61. Coil 61 is ganged to the RF plate output coil 57 as indicated at 62.

A capacity divider comprising condensers 63 and 64 is used in the tank of the oscillator circuit, namely, across coil 61. To reduce the amount of oscillator voltage feeding back into the plate 56 of the RF amplifier section 50′, the values of condensers 63 and 64 are so chosen that for the oscillator frequencies involved in the system the tap 65 is close to ground potential to minimize oscillator radiation. A grid leak resistance 66 couples the grid 60 of the oscillator-mixer with the grounded cathode 61′ thereof.

The B+ supply is applied to the RF section 50′ through RF choke coil 67. The B+ supply to the oscillator-mixer 50″ is supplied through a dropping resistor 68 and isolation choke 69. The IF output at lead 70 of the FM tuner is derived from inductance 71 tuned to the IF frequency ($f_m$) shunted by a suitable condenser 72. The slug 73 within coil 71 is used to adjust for maximum tuner output at the desired system IF frequency. The IF output may, for example, be at frequency $f_m$=11.7 mc. when used in conjunction with the TV converter system of aforementioned U.S. Patent No. 3,135,922. Alternatively, the IF may be at 10.7 mc. when used in the conventional type of commercial FM broadcast receiver.

An important feature of the present invention is the provision of the automatic frequency control or AFC for the FM tuner in a simple and inexpensive manner. Prior art FM tuners utilize at least an additional tube to provide AFC for stabilizing the FM tuner and detection operation. A silicon junction diode 42 is used herein in a simple yet novel and very effective manner for this purpose. The silicon diode 42 is connected between lead 41 from the ratio detector or frequency discriminator (not shown in FIG. 1), to the oscillator of the tuner. The ratio detector having a fixed carrier frequency therein, provides the AFC voltage or back bias for the diode 42 through lead 41.

The silicon junction diode has a characteristic that varies in capacitance with the amount of power bias applied to it. Such capacitance varies as much as three-to-one. The diode 42 acts as a variable capacity in the tuner oscillator circuit in correspondence with the back bias applied thereto through lead 41 in a manner now more fully described.

The silicon junction diode 42 is coupled to the input of the mixer-oscillator circuit 50″ through lead 74 and coupling condenser 75. The lead 41 connected to the diode 42 enters the FM tuner chassis through feed-through condenser 75. The output lead 70 of the FM tuner passes through the chassis preferably through a feed-through condenser 77. Feed-through condensers 76 and 77 are desirably 1,000 mfd. The back-bias from the receiver ratio detector, as applied to the silicon junction diode 42, causes its capacity value to correspondingly change thereby varying the frequency of the oscillator section of the autodyne mixer 50″ to stabilize the operation of the overall system, as will now be understood by those skilled in the art.

An important advantage of the use of the silicon junction diode 42 herein is that it does not require any operating or standby power. Also it is a high resistance device as compared to even germanium diodes. Further, it is an extremely simple and compact manner of providing effective AFC for the FM tuner system and permits the construction of a stabilized FM tuner with only a single tube (50′–50″). A pentode section may be used at 50″ instead of the triode for the autodyne mixer-oscillator to afford approximately 6 db more gain at output 70.

While the present invention has been described in connection with an exemplary embodiment thereof it is to be understood that the principles and features thereof are subject to modification and variation by those skilled in the art, without departing from the broader spirit and scope thereof as defined in the following claims.

The embodiments of the invention in which an exclusive privilege or property is claimed are defined as follows:

1. A tuner of broadcast FM modulated signals for an FM receiver comprising an oscillator-mixer stage for generating a frequency and heterodyning the signals with said frequency; said oscillator-mixer stage having an input grid for combinedly receiving said frequency and signals; a frequency determining circuit connected to said input grid; said frequency determining circuit comprising a first and second parallel path, having common first and second end terminals; said first parallel path including a series connected inductor and first capacitor having a common junction terminal; said second parallel path including a second capacitor; said second terminal connected to said input grid and said first terminal connected to the source of said signals; said first and second capacitor forming a capacity divider circuit, with the values thereof selected to place said first terminal at ground potential; a junction silicon diode circuit connected to said frequency determining circuit and connectable to a bias voltage from the FM detector stage of the receiver to effect automatic changes in the oscillator frequency by variable capacitive action in the diode and thereby establish effective AFC for the FM detector operation.

2. A tuner of broadcast FM modulated signals for an FM receiver as set forth in claim 1, wherein said junction silicon diode is circuit connected to the common junction terminal of said first parallel path within said frequency determining circuit.

3. A tuner of broadcast FM modulated signals for an FM receiver as set forth in claim 1, wherein said junction silicon diode is circuit connected to said bias voltage via a feedthrough condenser means.

References Cited by the Examiner

UNITED STATES PATENTS 2,936,428 5/60 Scheitzer ------------- 325—346

OTHER REFERENCES

Johnstone, "Junction Diode A.F.C. Circuit," Wireless World, August 1956, pp. 354–5.

Straube, "A Voltage Variable Capacitor," Electronics Industries, May 1958, pp. 69–73.

DAVID G. REDINBAUGH, *Primary Examiner.*